(12) United States Patent
Nagase et al.

(10) Patent No.: US 8,305,663 B2
(45) Date of Patent: Nov. 6, 2012

(54) SIGNAL GENERATOR, IMAGE READING DEVICE, AND IMAGE FORMING APPARATUS

(75) Inventors: Masaki Nagase, Kanagawa (JP); Tohru Kanno, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 1051 days.

(21) Appl. No.: 12/204,355

(22) Filed: Sep. 4, 2008

(65) Prior Publication Data

US 2009/0059324 A1 Mar. 5, 2009

(30) Foreign Application Priority Data

Sep. 5, 2007 (JP) ................. 2007-230307
Aug. 12, 2008 (JP) ................. 2008-207823

(51) Int. Cl.
*H04N 1/46* (2006.01)
*H04N 1/40* (2006.01)

(52) U.S. Cl. ......... 358/513; 358/514; 358/515; 358/1.1; 358/445; 358/505; 358/512; 358/3.27; 358/3.26

(58) Field of Classification Search ................. 358/513, 358/514, 515, 1.1, 445, 505, 512, 3.27, 3.26
See application file for complete search history.

(56) References Cited

U.S. PATENT DOCUMENTS

| 5,408,113 | A | 4/1995 | Kanno et al. | |
| 6,198,349 | B1 | 3/2001 | Kanno et al. | |
| 6,426,804 | B1 | 7/2002 | Kanno et al. | |
| 7,375,864 | B2 | 5/2008 | Kanno | |
| 2007/0188638 | A1* | 8/2007 | Nakazawa et al. | 348/294 |
| 2008/0024842 | A1 | 1/2008 | Tsukahara et al. | |
| 2008/0068467 | A1 | 3/2008 | Kanno et al. | |
| 2008/0068683 | A1 | 3/2008 | Kanno | |
| 2008/0106748 | A1* | 5/2008 | Tsukahara et al. | 358/1.1 |
| 2008/0212146 | A1 | 9/2008 | Tsukahara et al. | |

FOREIGN PATENT DOCUMENTS

JP 4059500 12/2007

\* cited by examiner

*Primary Examiner* — Madelein A Nguyen
*Assistant Examiner* — Quang N Vo
(74) *Attorney, Agent, or Firm* — Oblon, Spivak, McClelland, Maier & Neustadt, L.L.P.

(57) ABSTRACT

A clock-signal generating unit generates temporally-continuous clock signals. A spread-spectrum clock-signal generating unit generates a spread-spectrum clock signal by modulating a frequency spectrum of a clock signal generated by the clock-signal generating unit. A signal delaying unit generates a fixed delay unaffected by a spread spectrum from the spread-spectrum clock signal generated by the spread-spectrum clock-signal generating unit, and delays a phase of the spread-spectrum clock signal based on an amount of the fixed delay.

6 Claims, 14 Drawing Sheets

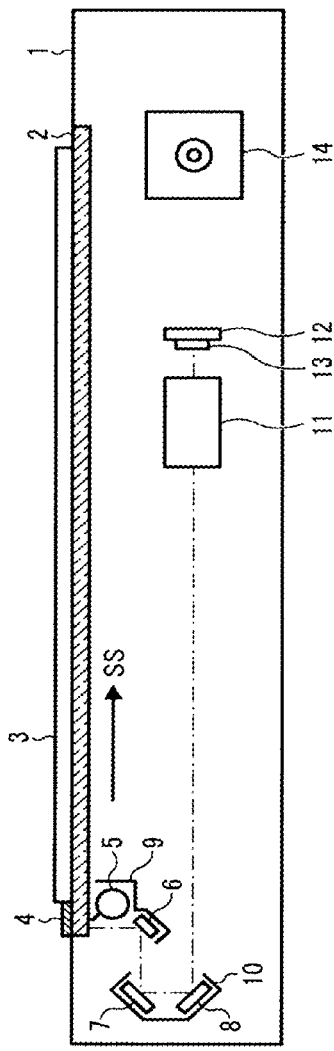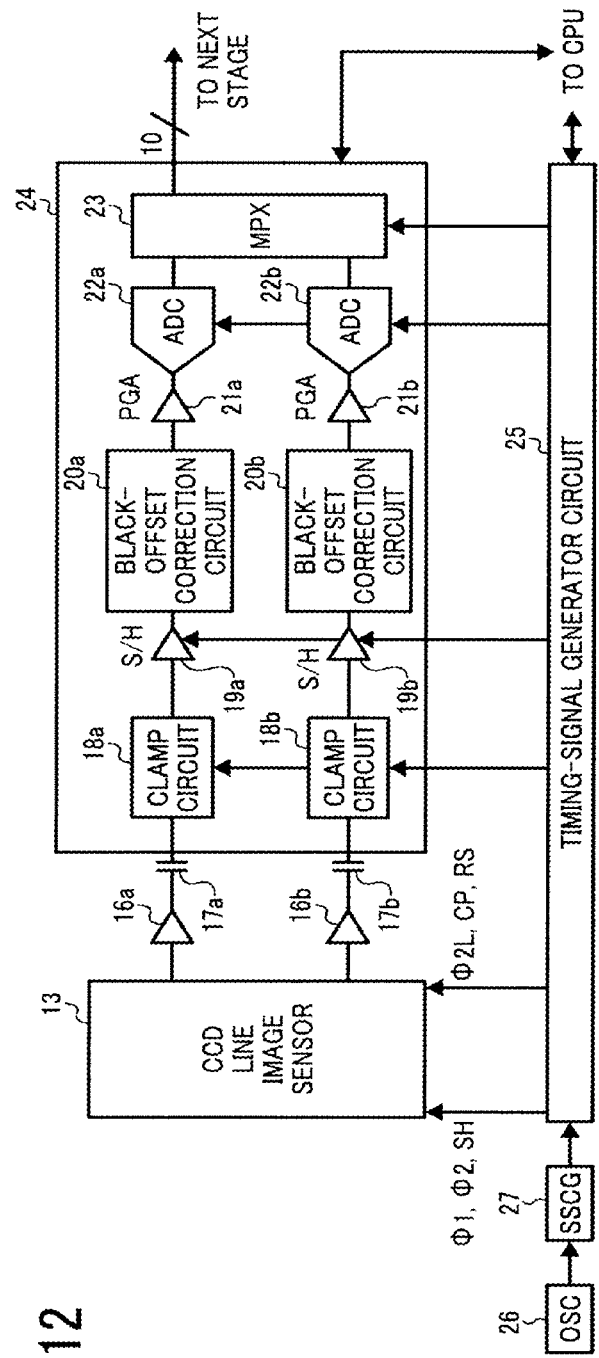
FIG. 11
FIG. 12

US 8,305,663 B2

SIGNAL GENERATOR, IMAGE READING DEVICE, AND IMAGE FORMING APPARATUS

CROSS-REFERENCE TO RELATED APPLICATIONS

The present application claims priority to and incorporates by reference the entire contents of Japanese priority document 2007-230307 filed in Japan on Sep. 5, 2007 and Japanese priority document 2008-207823 filed in Japan on Aug. 12, 2008.

BACKGROUND OF THE INVENTION

1. Field of the Invention

The present invention relates to a signal generator that generates a clock signal for enhancing image quality of a read image, and an image reading device and an image forming apparatus with a capability of enhancing image quality of the read image.

2. Description of the Related Art

In a typical image reading device, for example, as disclosed in Japanese Patent Application Laid-open No. 2005-151296, an exposure device exposes an original put on an exposure glass to a light, and a line image sensor senses an incoming light reflected on the original thereby reading an image of the original. The image reading device samples an analog image signal output from the line image sensor, and converts the analog image signal into a digital signal as image data on the read original.

FIG. 11 shows a configuration example of an optical system of the image reading device.

The image reading device shown in FIG. 11 includes an exposure glass 2, a white reference plate 4, a lamp 5, a first mirror 6, a second mirror 7, a third mirror 8, a first carriage 9, a second carriage 10, a lens 11, a read control board 12, a charge-coupled device (CCD) line image sensor 13, and a scanner motor 14. The exposure glass 2 is arranged on top of a housing 1 of the image reading device. An original 3 to be read is put on the exposure glass 2. In an actual apparatus, a pressure plate is usually provided on the back side of the original 3 so as to press a reading surface of the original 3 against the exposure glass 2. For sake of simplicity, the pressure plate is omitted from FIG. 11. The white reference plate 4 is arranged on top of a left-side end portion (corresponding to a read starting position) of the exposure glass 2. The white reference plate 4 serves as a white reference image used for a shading correction.

The lamp 5 illuminates the reading surface of the original 3. A light reflected on the reading surface is further reflected on the first mirror 6, the second mirror 7, and the third mirror 8 sequentially, and guided to the lens 11. The reflected light is focused by the lens 11, and delivered to the CCD line image sensor 13 installed on the read control board 12.

The lamp 5 and the first mirror 6 are housed in the first carriage 9. The second mirror 7 and the third mirror 8 are housed in the second carriage 10. The first and second carriages 9 and 10 respectively reciprocate in a sub-scanning direction SS. The second carriage 10 reciprocates at half speed of that of the first carriage 9 to maintain an optical path length from the exposure glass 2 to the CCD line image sensor 13.

The scanner motor 14 drives the first and second carriages 9 and 10 to reciprocate.

FIG. 12 is a block diagram of the read control board 12. A process of obtaining a digital image signal from an output signal from the CCD line image sensor 13 is explained below with reference to FIG. 12.

First, the CCD line image sensor 13 outputs an image signal Ve (for even pixels) and an image signal Vo (for odd pixels) in synchronization with a drive pulse. The image signals Ve and Vo respectively pass through emitter-follower circuits 16a and 16b, and are alternating-current (AC) coupled by capacitors 17a and 17b. An offset potential of each of the image signals Ve and Vo after the AC coupling is direct-current (DC) restored by each of clamp circuits 18a and 18b.

After that, sample-and-hold (S/H) circuits 19a and 19b respectively sample and hold a voltage level of each of the image signals Ve and Vo in response to a timing signal from an external device, and convert the image signals Ve and Vo into image signals having a continuous signal level (i.e., image signals from which reset noise and the like in the CCD line image sensor 13 are filtered out).

An offset level (an image signal level in an aphotic state) of each of the image signals Ve and Vo output from the CCD line image sensor 13 is compensated by the application of an appropriate analog offset by each of black-offset correction circuits 20a and 20b. Therefore, the image signals Ve and Vo can be prevented from negative saturation.

After that, programmable gain amplifier (PGA) circuits 21a and 21b respectively amplify the image signals Ve and Vo so that the voltage levels of which can be increased to a predetermined voltage level. Then, analog-to-digital converter (ADC) circuits 22a and 22b respectively convert the amplified image signals Ve and Vo into 10-bit digital image data De and Do. A multiplexer (MPX) circuit 23 synthesizes an even-pixel image and an odd-pixel image of each of the digital image data De and Do.

In general, the clamp circuits 18a and 18b, the S/H circuits 19a and 19b, the black-offset correction circuits 20a and 20b, the PGA circuits 21a and 21b, and the ADC circuits 22a and 22b are integrated into an analog front end (AFE) integrated circuit (IC) device (hereinafter, "AFE device") 24.

The 10-bit digital image data is transmitted to an image processing unit (not shown) in a subsequent stage via an interface (I/F) unit (not shown). The image processing unit performs digital processing, such as a shading correction or a gamma correction, on the image data.

Timing signals (φ1, φ2, SH, φ2L, CP, RS, and SPL) required for driving the CCD line image sensor 13 and the AFE device 24 are generated by a timing-signal generator circuit 25. These timing signals will be explained in detail later.

A drive timing of driving the CCD line image sensor 13 and the AFE device 24, i.e., a timing of outputting each of the timing signals can be adjusted in such a manner that a central processing unit (CPU) of the external device sets data on the drive timing in a register of the timing-signal generator circuit 25 via a communication line.

The timing-signal generator circuit 25 uses an output from an oscillator (OSC) 26, such as a crystal oscillator, as a reference clock signal. A frequency spectrum of the reference clock is spread by a spread spectrum clock generator (SSCG) circuit 27, as will be described later.

In such a conventional image reading device, as a pixel density or an image-reading speed increases, a clock frequency for driving a optical-to-electrical conversion element, such as the CCD line image sensor 13, to read an image or for driving the AFE device 24 to process an image signal output from the optical-to-electrical conversion element in a subsequent stage is getting increased. As a result, unwanted radiation of electromagnetic wave is increased.

To avoid such a problem, there is disclosed a method of reducing an intensity of unwanted radiation (radiation noise) at a spectral peak frequency, for example, by providing a spectrum spreading element (in a case shown in FIG. 12, the SSCG circuit 27) in a subsequent stage of an oscillator used to generate a clock frequency or providing a spectrum spreading function in the oscillator.

For example, in a case shown in FIG. 13, a spectrum spreading device spreads a frequency spectrum of a clock having spectral characteristics as shown in a waveform S1, and thereby obtaining spectral characteristics as shown in a waveform S2 that an intensity of unwanted radiation (radiation noise) is dramatically reduced.

However, in the conventional image reading device with the circuit configuration shown in FIG. 12, when the SSCG circuit 27 is used in the analog timing-signal generator circuit, even if an image having a uniform concentration level is read, an image signal level in each main scanning line fluctuates up and down periodically due to a change in an output waveform of the CCD line image sensor 13 (hereinafter, "a CCD output waveform"). Such a phenomenon is explained below with reference to FIG. 14.

In general, a CCD driving clock for driving the CCD line image sensor 13 is generated based on a reference clock having an oscillation frequency at high accuracy of 50 parts per million (ppm) to 100 ppm. However, when a frequency spectrum of the clock is spread to cope with an intensity of unwanted radiation, as shown in FIG. 14($b$), the frequency changes with time. Specifically, the frequency undergoes a smooth transition in a predetermined frequency bandwidth of ±0.5%, ±1.0%, ..., of a frequency of the reference clock (a reference frequency). Incidentally, in a waveform diagram shown in FIG. 14($b$), a horizontal axis indicates time, and a vertical axis indicates frequency.

In this manner, the frequency has a periodical spread-spectrum cycle (a modulation cycle). After the frequency changes by a predetermined modulated width in a direction where the clock cycle is short with respect to the reference frequency (to the side of high frequency, i.e., + side), the frequency changes by the predetermined modulated width in a direction where the clock cycle is long with respect to the reference frequency (to the side of low frequency, i.e., − side) along the same characteristic curve. The frequency repeatedly changes in the above modulation cycles, and gets back to the reference frequency.

Therefore, a phase of the frequency is matched with that of the reference frequency by each half cycle of the modulation cycle.

FIG. 14($a$) shows a fluctuation in an image level with respect to the modulation cycle. In a waveform diagram shown in FIG. 14($a$), a horizontal axis indicates time, and a vertical axis indicates image level. The image level fluctuates in synchronization with the modulation cycle.

In the above example shown in FIG. 14, the fluctuation in the image level in one line is depicted. By repetition of the above fluctuation in a plurality of lines, as shown in FIG. 15, ups and downs of image levels appear as minute stripes KK1 and KK2, i.e., moire stripes on a read image.

It has been found that there are two major factors for the moire stripes, i.e., the fluctuation in the image level in synchronization with the modulation cycle. The two major factors are "a fluctuation in an offset level of the CCD output" and "a shift of a sampling point".

First, "the fluctuation in the offset level of the CCD output" is explained below.

FIG. 16 is a timing chart for explaining an example of a timing for driving the CCD line image sensor 13.

Timing clocks required for driving the CCD line image sensor 13 are transfer clocks φ1 and φ2, an RS clock, a CP clock, a φ2L clock, an SH signal, and an SPL clock. The transfer clocks φ1 and φ2 are used to transfer a signal charge obtained from a photodiode to an analog shift register. The RS clock is used to convert a voltage of the transferred signal charge and reset a floating capacitor provided in a source follower circuit by each pixel. The CP clock is used to determine an offset level of the CCD output waveform. The φ2L clock is required in a last stage of the charge transfer. The SH signal is used to transfer a charge accumulated in the photodiode to the analog shift register at an interval between exposure times. The SPL clock is used when the AFE device 24 determines a timing of driving the S/H circuits 19$a$ and 19$b$.

Out of the above timing clocks, the RS clock and the CP clock definitely overlap with each other when the apparatus is driven at high speed. At this time, the offset level of the output waveform of the CCD line image sensor 13 is determined based on a period from a falling edge of the RS clock to a falling edge of the CP clock.

When a frequency spectrum of each of the RS clock and the CP clock is spread, the period from the falling edge of the RS clock to the falling edge of the CP clock periodically changes due to the spread-spectrum modulation (see FIG. 17). As a result, the offset level of the CCD output fluctuates in synchronization with the modulation cycle, resulting in a fluctuation in image data.

Then, "the shift of the sampling point" is explained below.

After a predetermined delay (an output delay time) from a falling edge of the φ2L clock, the CCD line image sensor 13 starts an analog output for an image-signal output period (see FIG. 18). The S/H circuits 19$a$ and 19$b$ respectively sample and hold a voltage level of each of the image signals in this period. However, when a frequency spectrum of each of the φ2L clock and the SPL clock is spread, a period from a falling edge of the φ2L clock to a falling edge of the SPL clock changes in synchronization with the modulation cycle.

The output delay time is constant, so that the sampling point on the analog waveform is slightly shifted periodically. In FIG. 18B, the image-signal output period is depicted as flat. However, an output waveform of an actual CCD line image sensor has an irregular curved shape in the period. Therefore, when the sampling point is shifted, an output of a digital image signal that an analog image signal is converted thereinto is changed. As a result, image data fluctuates in synchronization with the modulation cycle.

SUMMARY OF THE INVENTION

It is an object of the present invention to at least partially solve the problems in the conventional technology.

According to an aspect of the present invention, there is provided a signal generator including a clock-signal generating unit that generates temporally-continuous clock signals; a spread-spectrum clock-signal generating unit that generates a spread-spectrum clock signal by modulating a frequency spectrum of a clock signal generated by the clock-signal generating unit; and a signal delaying unit that generates a fixed delay unaffected by a spread spectrum from the spread-spectrum clock signal generated by the spread-spectrum clock-signal generating unit, and delays a phase of the spread-spectrum clock signal based on an amount of the fixed delay.

Furthermore, according to another aspect of the present invention, there is provided an image reading device including an optical-to-electrical conversion element that receives an optical signal of an optical image, and outputs an electrical signal of an analog image signal corresponding to the optical image; an analog processing circuit that samples the analog image signal output from the optical-to-electrical conversion element to obtain continuous analog image signals, and amplifies a voltage of the analog image signals to a predetermined voltage; an analog-to-digital conversion circuit that quantizes an output from the analog processing circuit to generate a digital image signal; a clock generating unit that generates temporally-continuous clock signals; a spread-spectrum clock-signal generating unit that generates a spread-spectrum clock signal by modulating a frequency spectrum of a clock signal generated by the clock-signal generating unit; a clock-signal generating unit that generates a plurality of drive clock signals for driving the optical-to-electrical conversion element and the analog processing circuit from the spread-spectrum clock signal generated by the spread-spectrum clock-signal generating unit; and a signal delaying unit that generates, with respect to at least a first drive clock signal from among the drive clock signals, a fixed delay unaffected by a spread spectrum based on an edge timing of a second drive clock signal other than the first drive clock signal, and obtains a desired timing by applying the fixed delay to the first drive clock signal.

Moreover, according to still another aspect of the present invention, there is provided an image forming apparatus including an optical-to-electrical conversion element that receives an optical signal of an optical image, and outputs an electrical signal of an analog image signal corresponding to the optical image; an analog processing circuit that samples the analog image signal output from the optical-to-electrical conversion element to obtain continuous analog image signals, and amplifies a voltage of the analog image signals to a predetermined voltage; an analog-to-digital conversion circuit that quantizes an output from the analog processing circuit to generate a digital image signal; a clock generating unit that generates temporally-continuous clock signals; a spread-spectrum clock-signal generating unit that generates a spread-spectrum clock signal by modulating a frequency spectrum of a clock signal generated by the clock-signal generating unit; a clock-signal generating unit that generates a plurality of drive clock signals for driving the optical-to-electrical conversion element and the analog processing circuit from the spread-spectrum clock signal generated by the spread-spectrum clock-signal generating unit; a signal delaying unit that generates, with respect to at least a first drive clock signal from among the drive clock signals, a fixed delay unaffected by a spread spectrum based on an edge timing of a second drive clock signal other than the first drive clock signal, and obtains a desired timing by applying the fixed delay to the first drive clock signal; and an image forming unit that performs an image formation based on the digital image signal.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 11 is a schematic diagram of an example of an optical system of the image reading device;

FIG. 12 is a block diagram of a read control board included in an image reading device according to a conventional technology;

DETAILED DESCRIPTION OF THE PREFERRED EMBODIMENTS

Exemplary embodiments of the present invention are explained in detail below with reference to the accompanying drawings. Incidentally, in the embodiments described below, a signal generator according to the present invention is applied to an image reading device including a scanner. However, the present invention is not limited to the embodiments. For example, the signal generator according to the present invention can be applied to an image forming apparatus including a scanner, such as a copier, a facsimile machine, and a digital multifunction product (MFP) including functions of the scanner, the copier, and the facsimile machine all in one package.

Figure 1:
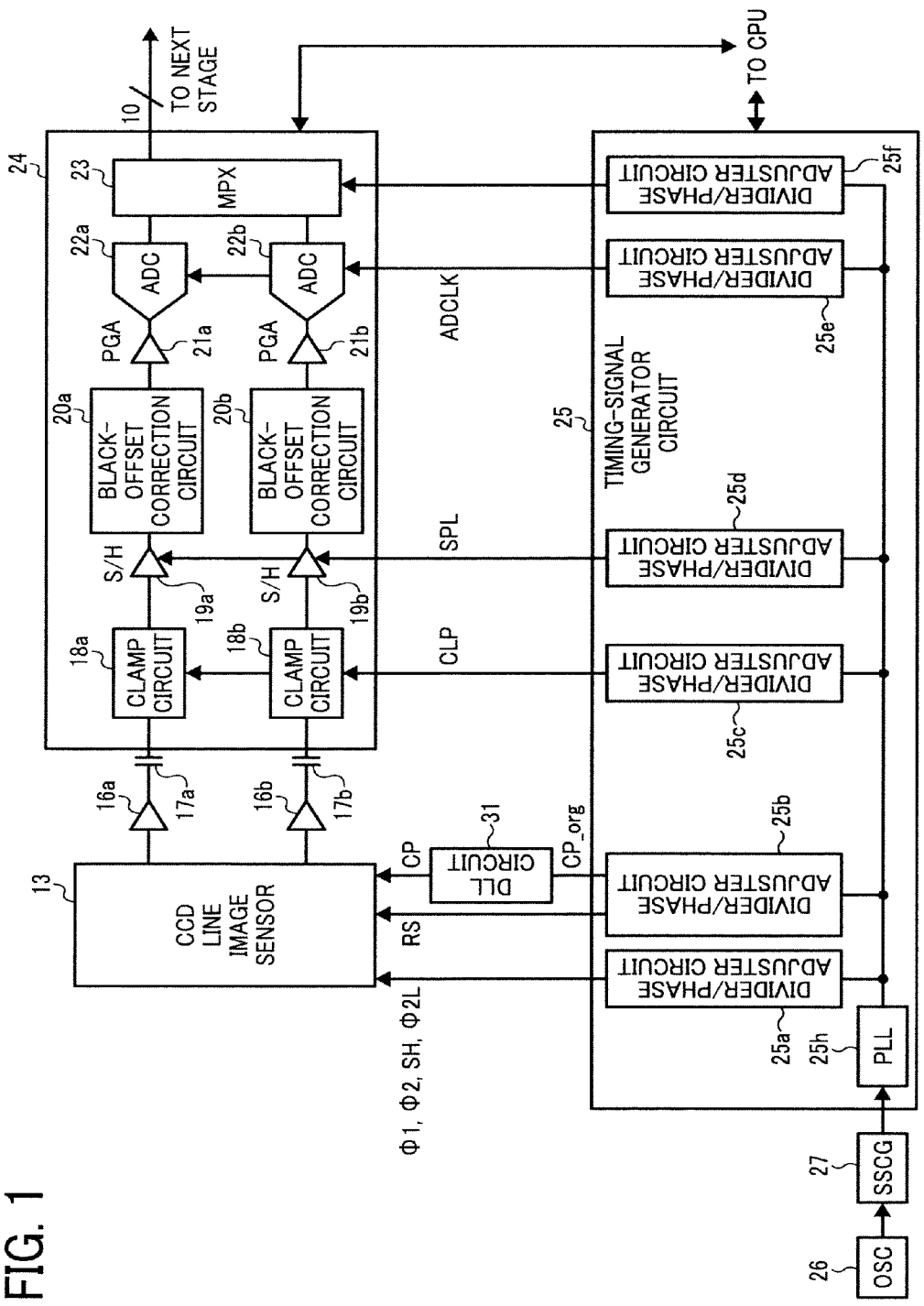
FIG. 1 is a block diagram of a read control board included in an image reading device according to a first embodiment of the present invention.

FIG. 1 is a block diagram of the read control board 12 included in an image reading device according to a first embodiment of the present invention. The portions identical to those in FIG. 12 are denoted with the same reference numerals, and the description of those portions is omitted.

A difference between the read control boards 12 shown in FIGS. 1 and 12 is that the read control board 12 shown in FIG. 1 further includes a delay locked loop (DLL) circuit 31 and the timing-signal generator circuit 25 shown in FIG. 1 includes divider/phase adjuster circuits 25a to 25f and a phase locked loop (PLL) circuit 25h. In the first embodiment, after multiplying an output from the SSCG circuit 27 as an oscillation source clock, the PLL circuit 25h outputs the oscillation source clock to the divider/phase adjuster circuits 25a to 25*f*. The divider/phase adjuster circuit 25*a* generates clocks φ1 and φ2, an SH signal, and a clock φ2L. The divider/phase adjuster circuit 25*b* generates a reset signal RS (an RS clock) and a clamp signal CP_org (a CP_org clock). The divider/phase adjuster circuit 25*c* generates a signal CLP to be output to the clamp circuits 18*a* and 18*b*. The divider/phase adjuster circuit 25*d* generates a sample-and-hold pulse SPL to be output to the S/H circuits 19*a* and 19*b*. The divider/phase adjuster circuit 25*e* generates a conversion timing signal ADCLK to be output to the ADC circuits 22*a* and 22*b*. The divider/phase adjuster circuit 25*f* generates a signal to be output to the MPX circuit 23. A frequency of the oscillation source clock is arbitrarily divided by the divider/phase adjuster circuits 25*a* to 25*f* so that each of the divider/phase adjuster circuits 25*a* to 25*f* generates a necessary timing signal (a timing clock) with the use of the frequency-divided clock. A pulse width and a phase of each of the clocks can be adjusted in a unit of the clock multiplied by the PLL circuit 25*h*.

The clocks φ1 and φ2 are respectively a transfer clock used for charge transfer on the analog shift register after a signal charge obtained from a photodiode array in the CCD line image sensor 13 is transferred to the analog shift register. The SH signal is a timing signal used to transfer a charge accumulated in the photodiode to the analog shift register at an interval between exposure times. The clock φ2L is a last-stage transfer clock for determining a timing at which an output gate of the analog shift register in the last stage is turned ON. At this timing, the charge is transferred to the floating capacitor. The reset signal RS is a timing clock for initializing a voltage of the floating capacitor provided in the source follower circuit, which is provided in the CCD line image sensor 13 and outputs an image signal to outside the CCD line image sensor 13, by each pixel of the image signal. The clamp signal CP_org is a timing clock for determining a clamp timing of an offset voltage of an output waveform of the CCD line image sensor 13.

Out of the plurality of the timing clocks for driving the CCD line image sensor 13 and the AFE device 24, the CP_org clock for driving the CCD line image sensor 13 is generated so that a timing of one of edges (i.e., any of a rising edge and a falling edge) of the CP_org clock is to be the same timing as one of edges of the RS clock output from the timing-signal generator circuit 25. The DLL circuit 31 delays the CP_org clock, and outputs the delayed CP_org clock as a CP clock to the CCD line image sensor 13.

Figure 2:
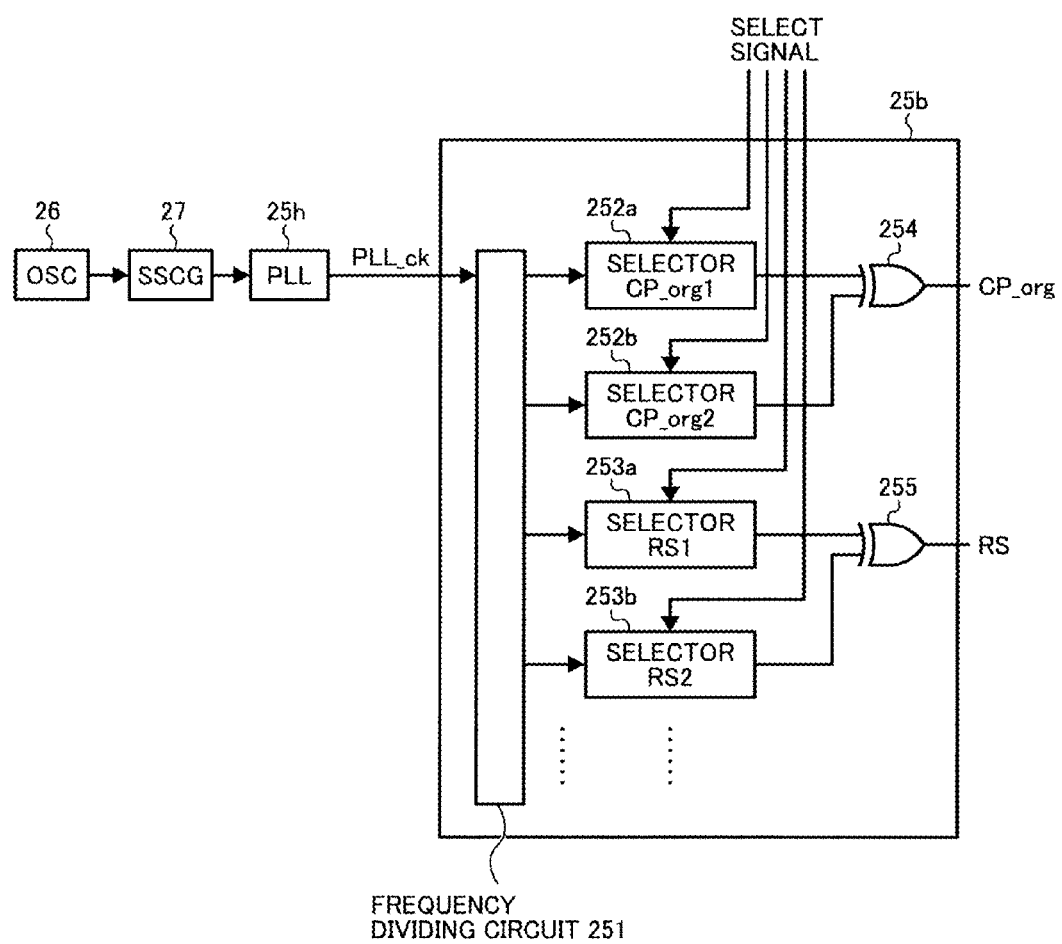
FIG. 2 is a circuit diagram of a divider/phase adjuster circuit that generates a CP_org clock and an RS clock.

Subsequently, how the CP_org clock and the RS clock are generated is explained below. FIG. 2 is a circuit diagram of the divider/phase adjuster circuit 25*b* that generates the CP_org clock and the RS clock.

Upon receiving an oscillation source clock from the OSC 26, the SSCG circuit 27 modulates a frequency of the oscillation source clock, and outputs the frequency-modulated clock to the PLL circuit 25*h*. The PLL circuit 25*h* multiplies the frequency-modulated clock to have a required frequency thereby generating a clock PLL_ck, and outputs the clock PLL_ck to a frequency dividing circuit 251.

Upon receiving the clock PLL_ck from the PLL circuit 25*h*, the frequency dividing circuit 251 equally divides a frequency of the clock PLL_ck into eight portions, and generates ⅛ frequency-divided clocks 1 to 8 those having a different phase from one another.

A selector CP_org1 252*a* and a selector CP_org2 252*b* respectively select any of the ⅛ frequency-divided clocks 1 to 8 having a phase corresponding to that of a clock edge to be generated in the CP_org clock. Then, an EXCLUSIVE-OR (EX-OR) circuit 254 calculates an EXCLUSIVE-OR of the two ⅛ frequency-divided clocks selected by the selector CP_org1 252*a* and the selector CP_org2 252*b*, and generates the target CP_org clock based on the calculated EXCLUSIVE-OR.

Likewise, a selector RS1 253*a* and a selector RS2 253*b* respectively select any of the ⅛ frequency-divided clocks 1 to 8 having a phase corresponding to that of a clock edge to be generated in the RS clock. Then, an EX-OR circuit 255 calculates an EXCLUSIVE-OR of the two ⅛ frequency-divided clocks selected by the selector RS1 253*a* and the selector RS2 253*b*, and generates the target RS clock based on the calculated EXCLUSIVE-OR.

Each of the selectors, such as the selector CP_org1 252*a*, the selector CP_org2 252*b*, the selector RS1 253*a*, and the selector RS2 253*b*, selects any of the ⅛ frequency-divided clocks 1 to 8 upon receiving a select signal from a register unit (not shown) of the timing-signal generator circuit 25. As for an instruction to the register unit to send the select signal, a corresponding value is written on the register unit by the CPU of the external device via a serial communication.

Figure 3:
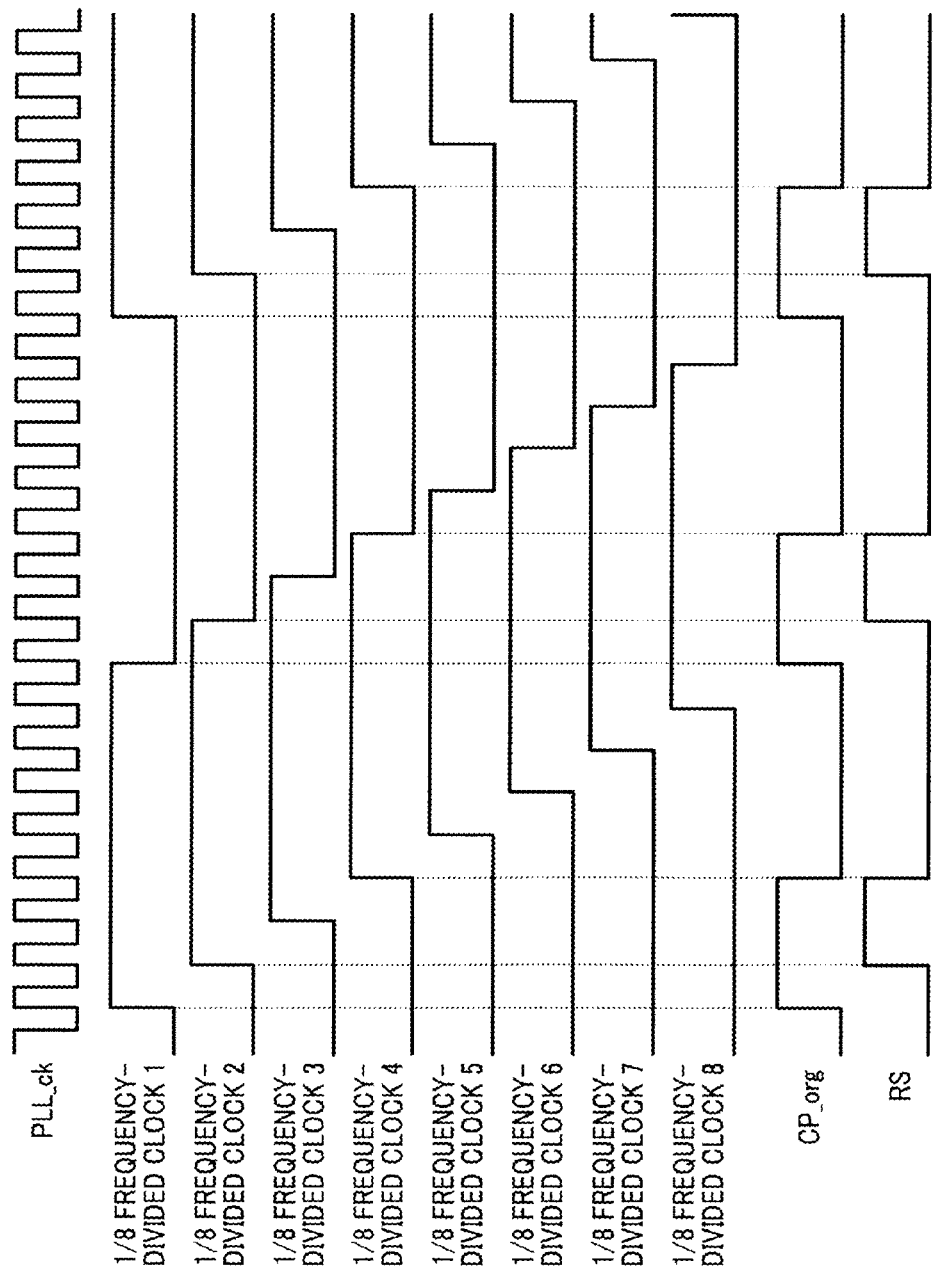
FIG. 3 is timing charts of a PLL_ck, ⅛ frequency-divided clocks, the CP_org clock, and the RS clock.

FIG. 3 is timing charts of the PLL_ck, the ⅛ frequency-divided clocks 1 to 8, the CP_org clock, and the RS clock. In this case, the ⅛ frequency-divided clocks 1 and 4 are selected to generate the CP_org clock, and the ⅛ frequency-divided clocks 2 and 4 are selected to generate the RS clock.

Figure 4:
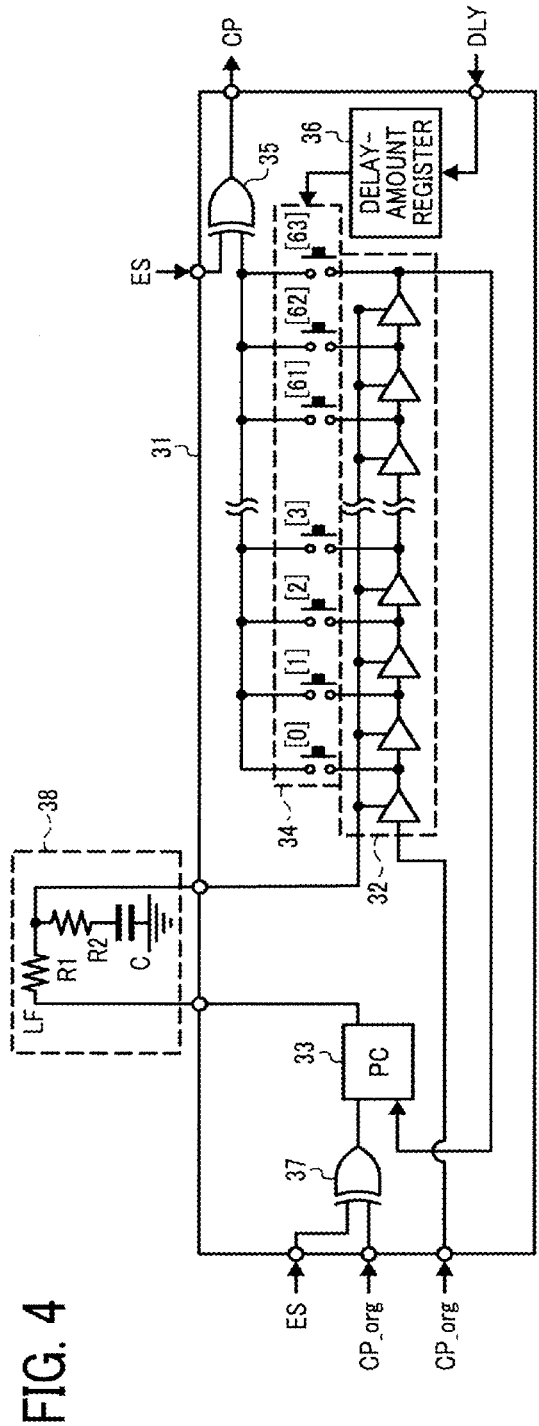
FIG. 4 is a circuit diagram of a delay locked loop (DLL) circuit shown in FIG. 1.

Subsequently, the DLL circuit 31 is explained below. FIG. 4 is a circuit diagram of the DLL circuit 31.

Upon receiving the CP_org clock signal from the timing-signal generator circuit 25, the DLL circuit 31 inputs the CP_org clock signal to a delay circuit 32 in which sixty-four stages of delay elements are connected in series. An output from the last-stage delay element of the delay circuit 32 is input to one of input terminals of a phase comparator (PC) 33.

Any one of outputs from the delay elements of the delay circuit 32 is selected by a delay selector 34, and input to one of input terminals of an EX-OR circuit 35 composing an output circuit. A signal ES for specifying to generate a fixed delay at either a falling edge or a rising edge of the CP_org clock is input to the other input terminal of the EX-OR circuit 35.

An amount of delay of the output selected by the delay selector 34 is specified based on a delay-amount set value DLY stored in a delay-amount register 36. The delay-amount register 36 is provided to store therein the delay-amount set value DLY. The delay-amount set value DLY can be arbitrarily rewritten, for example, by the CPU of the external device.

Upon receiving the CP_org clock signal from the timing-signal generator circuit 25, the DLL circuit 31 also inputs the CP_org clock signal to one of input terminals of an EX-OR circuit 37 composing an input circuit. The signal ES for specifying to generate the fixed delay at either the falling edge or the rising edge of the CP_org clock is input to the other input terminal of the EX-OR circuit 37.

An output from the EX-OR circuit 37 is input to the other input terminal of the PC 33. The PC 33 outputs a signal depending on a phase difference between the received two signals. A loop filter (LF) 38 filters out noise from the signal output from the PC 33, and outputs the signal to the delay elements of the delay circuit 32.

The LF 38 has such frequency characteristics that a modulation frequency applied by the SSCG circuit 27 does not get through (decays), i.e., a cutoff frequency of the LF 38 is sufficiently smaller than the modulation frequency applied by the SSCG circuit 27. More specifically, as one example, each of constants R1, R2, and C of the LF 38 is defined as follows.

Cutoff frequency=$1/2\pi C(R1+R2)$

SSCG modulation frequency=30 kHz (The constants R and C are set up so that the cutoff frequency is smaller than 30 kHz.)

In this manner, upon receiving the CP_org clock from the external device, the DLL circuit 31 generates such an amount of delay that one cycle of the CP_org clock between falling edges is divided into sixty-four. An amount of the maximum delay is fed back to the PC 33, so that the PC 33 outputs a phase difference of which to the LF 38 as a voltage. The LF 38 filters out noise, and updates an amount of delay by each delay step. By such a feedback, it is possible to obtain such an amount of delay that one cycle of the CP_org clock is equally divided into sixty-four. Therefore, an amount of the fixed delay does not respond to the spread-spectrum modulation by the SSCG circuit 27. In other words, an amount of the fixed delay is not affected by the modulation cycle of the spread-spectrum modulation.

When an amount of delay is generated based on the rising edge, a logic architecture of ES terminals is just switched. Furthermore, the frequency spectrum of the CP_org clock is spread by the SSCG circuit 27, so that an output from the PC 33 fluctuates in synchronization with the modulation cycle. However, because of the frequency characteristics of the LF 38, the modulation frequency applied by the SSCG circuit 27 does not get through (decays), so that such a delay step that a mean cycle of the frequency-modulated CP_org clock is equally divided into sixty-four can be obtained.

Figure 5:
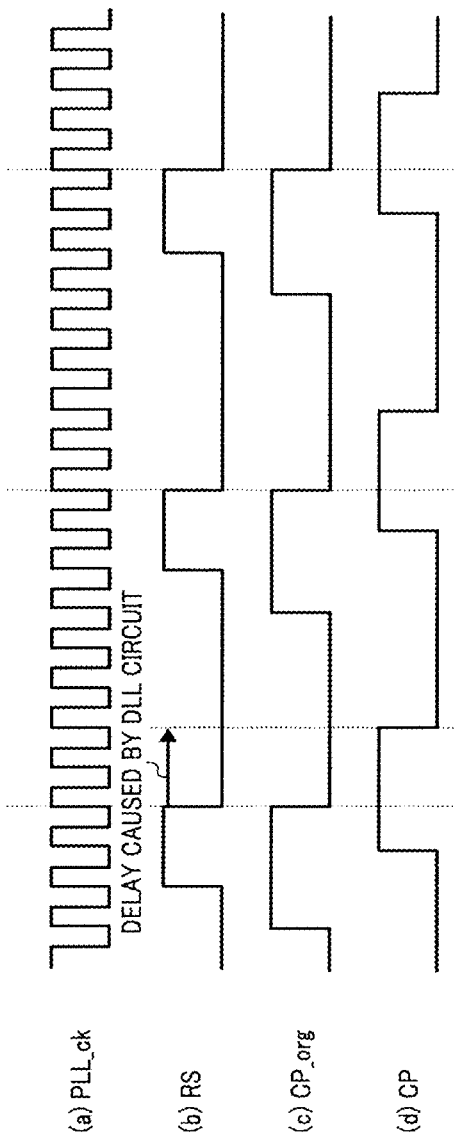
FIG. 5 is a waveform diagram for explaining an operation of the DLL circuit shown in FIG. 1.

Then, as shown in FIG. 5, the CP_org clock with the amount of delay specified based on the delay-amount set value DLY in each of the stages 0 to 63 (the sixty-four stages) is output to the external device as the CP clock. At this time, without any effect of the spread-spectrum modulation by the SSCG circuit 27, a differential delay between a falling edge of the CP_org clock and a falling edge of the CP clock is stable.

As described above, in the first embodiment, the DLL circuit 31 delays a period between a falling edge of the RS clock (in the same phase as a falling edge of the CP_org clock) to be output to the CCD line image sensor 13 and a falling edge of the CP clock to be output to the CCD line image sensor 13 by a predetermined amount of delay capable of being unaffected by a modulation cycle of spread-spectrum modulation. Therefore, the effect of the spread-spectrum modulation by the SSCG circuit 27 can be eliminated, and the fluctuation in the offset level of the CCD output can be prevented. Consequently, it is possible to prevent a fluctuation in image data as the problem occurring in the conventional image reading device, and thus it is possible to enhance an image quality of a read image.

Figure 6:
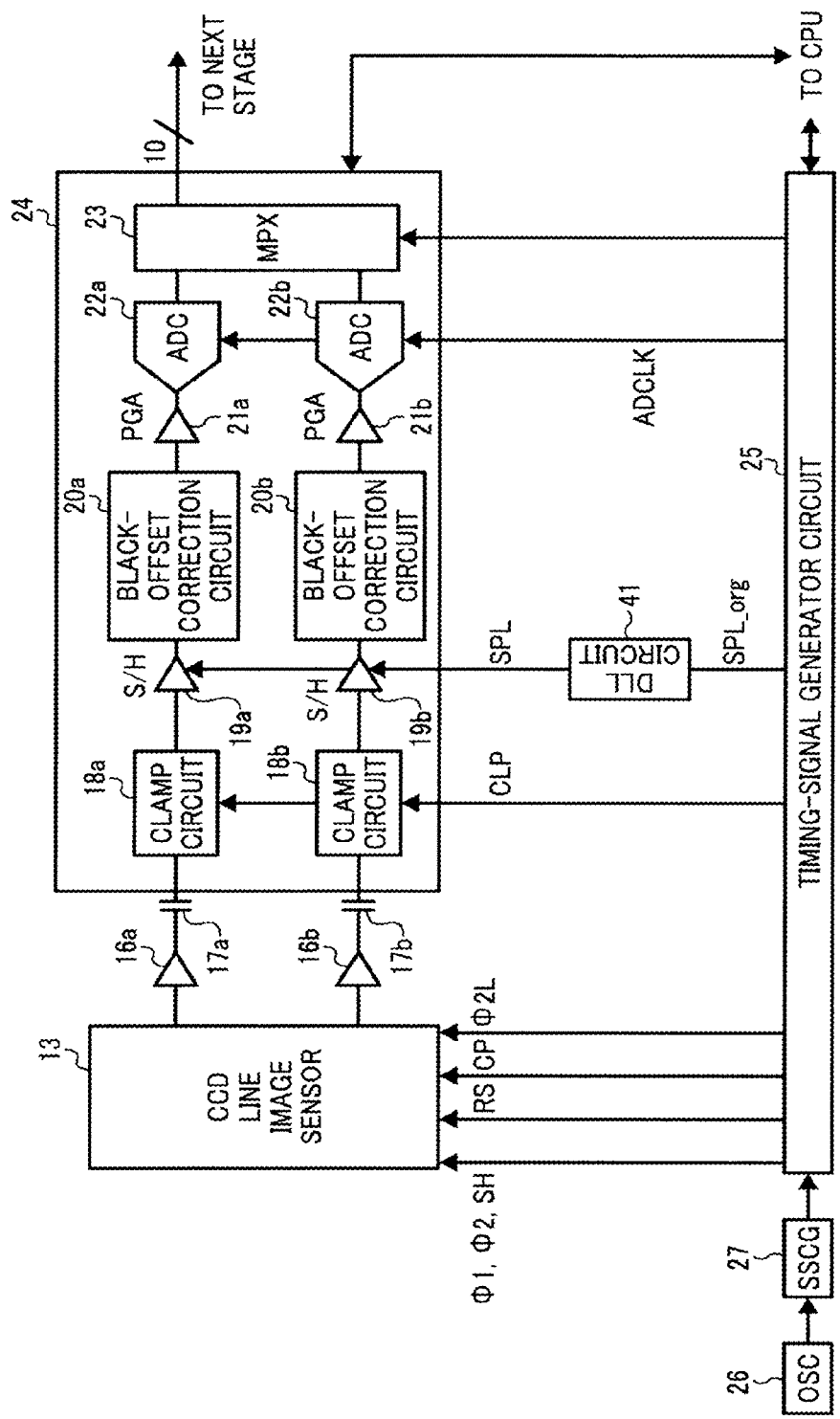
FIG. 6 is a block diagram of a read control board included in an image reading device according to a second embodiment of the present invention.

FIG. 6 is a block diagram of the read control board 12 included in an image reading device according to a second embodiment of the present invention. The portions identical to those in FIGS. 1 and 12 are denoted with the same reference numerals, and the description of those portions is omitted.

In the second embodiment, the PLL circuit (not shown in FIG. 6) in the timing-signal generator circuit 25 multiplies an output from the SSCG circuit 27 as an oscillation source clock to have a required frequency, and divides the frequency of the multiplied clock so that the timing-signal generator circuit 25 can generate drive timing clocks (timing clocks) for driving the CCD line image sensor 13 and the AFE device 24. A pulse width and a phase of each of the clocks can be adjusted in a unit of the clock multiplied by the PLL circuit.

Out of the plurality of the timing clocks for driving the CCD line image sensor 13 and the AFE device 24, an SPL_org clock output from the timing-signal generator circuit 25 is delayed by a DLL circuit 41, and the delayed SPL_org clock is output as an SPL clock for driving the S/H circuits 19a and 19b. At this time, a timing of one of edges (i.e., any of a falling edge and a rising edge) of the SPL_org clock is generated to be the same timing as one of edges of a last-stage shift pulse signal (a φ2L clock) output from the timing-signal generator circuit 25.

Figure 7:
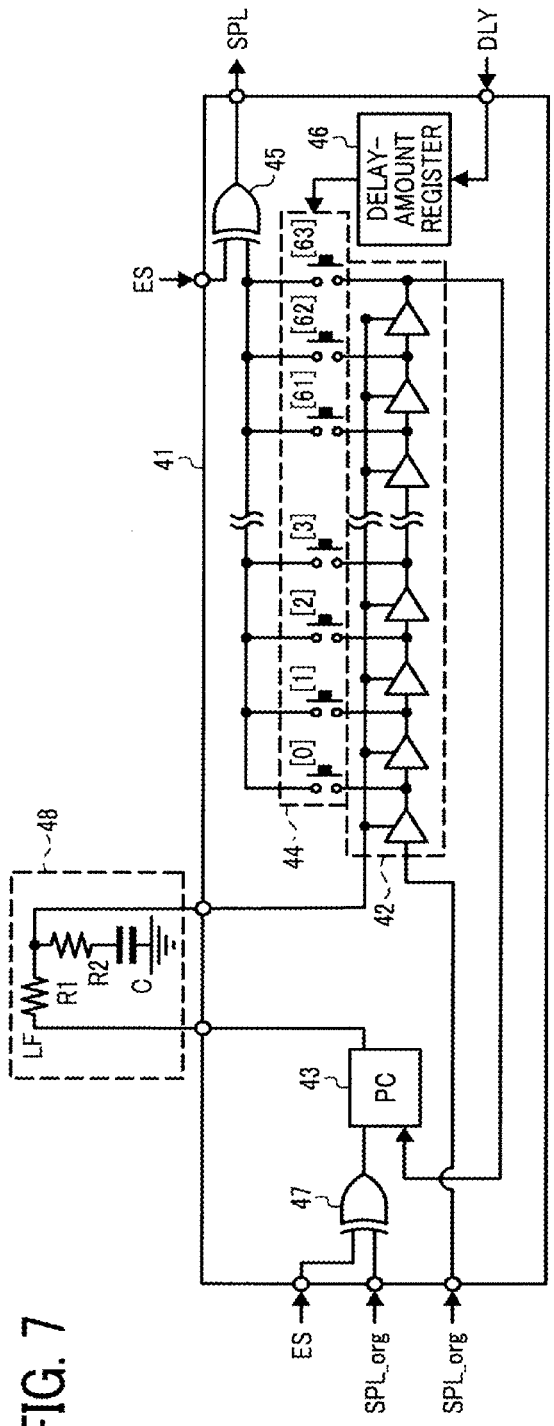
FIG. 7 is a circuit diagram of a DLL circuit shown in FIG. 6.

FIG. 7 is a circuit diagram of the DLL circuit 41.

A signal of the SPL_org clock is input to a delay circuit 42 in which sixty-four stages of delay elements are connected in series. An output from the delay element in the last stage of the delay circuit 42 is input to one of input terminals of a PC 43.

Any one of outputs from the delay elements is selected by a delay selector 44, and input to one of input terminals of an EX-OR circuit 45 composing an output circuit. A signal ES for specifying to generate a fixed delay at either a falling edge or a rising edge of the SPL_org clock is input to the other input terminal of the EX-OR circuit 45.

An amount of delay of the output selected by the delay selector 44 is specified based on a delay-amount set value DLY stored in a delay-amount register 46. The delay-amount register 46 is provided to store therein the delay-amount set value DLY. The delay-amount set value DLY can be arbitrarily rewritten, for example, by the CPU of the external device.

The SPL_org clock is also input to one of input terminals of an EX-OR circuit 47 composing an input circuit. A signal ES for specifying to generate a fixed delay at either a falling edge or a rising edge of the SPL_org clock is input to the other input terminal of the EX-OR circuit 47.

An output from the EX-OR circuit 47 is input to the other input terminal of the PC 43. The PC 43 outputs a signal depending on a phase difference between the received two signals. A loop filter 48 filters out noise from the signal output from the PC 43, and outputs the signal to the delay elements of the delay circuit 42.

The loop filter 48 has such frequency characteristics that a modulation frequency applied by the SSCG circuit 27 does not get through (decays), i.e., a cutoff frequency of the loop filter 48 is sufficiently smaller than the modulation frequency applied by the SSCG circuit 27. More specifically, as one example, each of constants R1, R2, and C of the loop filter 48 is defined as follows.

Cutoff frequency=$1/2\pi C(R1+R2)$

SSCG modulation frequency=30 kHz (The constants R and C are set up so that the cutoff frequency is smaller than 30 kHz.)

The above equations make the constants not to respond to the modulation frequency in the spread-spectrum modulation. Therefore, even when the spread-spectrum clock is used as a reference clock, it is possible to generate a fixed delay capable of being unaffected by the spread-spectrum modulation.

In this manner, upon receiving the SPL_org clock from the external device, the DLL circuit 41 generates such an amount of delay that one cycle of the SPL_org clock between falling edges is divided into sixty-four. An amount of the maximum delay is fed back to the PC 43, so that the PC 43 outputs a phase difference of which to the loop filter 48 as a voltage. The loop filter 48 filters out noise, and resets the delay step.

By such a feedback, it is possible to obtain such an amount of delay that one cycle of the SPL_org clock is equally divided into sixty-four.

When an amount of delay is generated based on the rising edge, a logic architecture of ES terminals is just switched. Furthermore, the frequency of the SPL_org clock is spread by the SSCG circuit 27, so that an output from the PC 43 fluctuates in synchronization with the modulation cycle of the spread-spectrum modulation by the SSCG circuit 27. However, because of the frequency characteristics of the loop filter 48, the modulation frequency applied by the SSCG circuit 27 does not get through (decays), so that such a delay step that a mean cycle of the spread-spectrum SPL_org clock is equally divided into sixty-four can be obtained.

Figure 8:
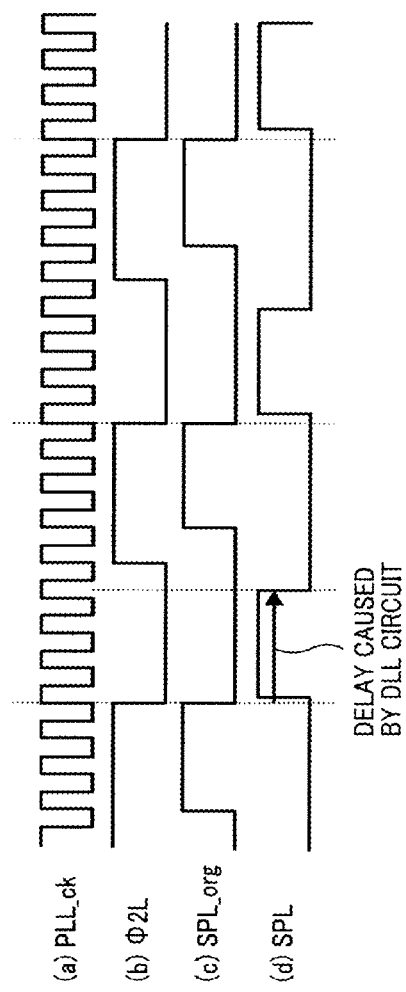
FIG. 8 is a waveform diagram for explaining an operation of the DLL circuit shown in FIG. 6.

Then, as shown in FIG. 8, the SPL_org clock with the amount of delay specified based on the delay-amount set value DLY in each of the stages 0 to 63 (the sixty-four stages) is output to the external device as an SPL clock. At this time, without any effect of the spread-spectrum modulation by the SSCG circuit 27, a differential delay between a falling edge of the SPL_org clock and a falling edge of the SPL clock is stable.

As described above, in the second embodiment, the DLL circuit 41 delays a period between a falling edge of the $\phi$2L clock (in the same phase as a falling edge of the SPL_org clock) to be output to the CCD line image sensor 13 and a falling edge of the SPL clock to be output to the CCD line image sensor 13 by a predetermined amount of delay capable of being unaffected by a modulation cycle of spread-spectrum modulation. Therefore, the effect of the spread-spectrum modulation by the SSCG circuit 27 can be eliminated. As a result, a period between one of edges of the $\phi$2L clock and one of edges of the SPL clock can be fixed, and thus it is possible to prevent an occurrence of stripes on a read image. Consequently, it is possible to enhance an image quality of the read image.

Figure 9:
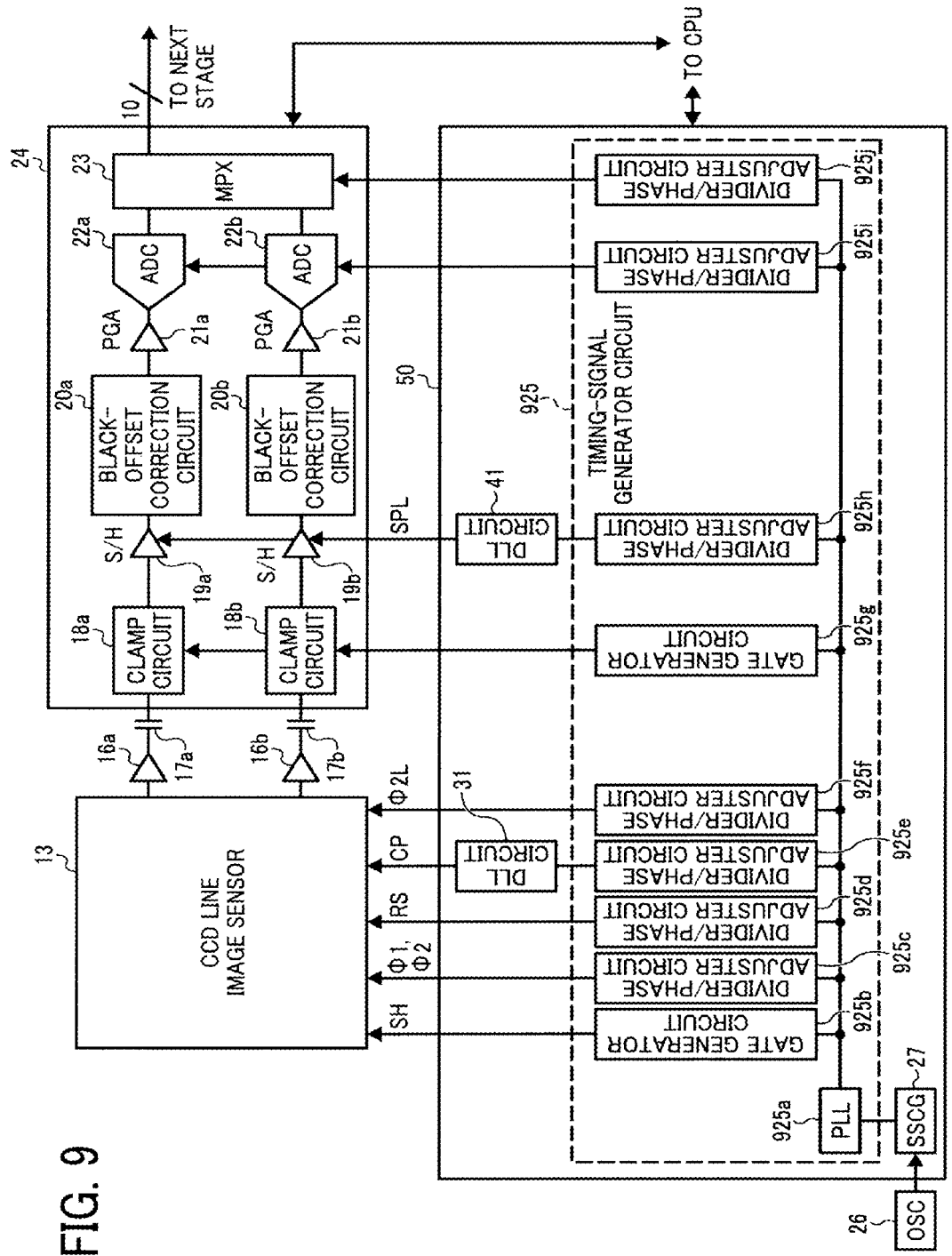
FIG. 9 is a block diagram of an example of a signal processing device according to a third embodiment of the present invention.

FIG. 9 is a block diagram for explaining an example of a signal processing device according to a third embodiment of the present invention. The SSCG circuit 27, a timing-signal generator circuit 925, the DLL circuit 31, and the DLL circuit 41 compose an application specific integrated circuit (ASIC) 50 as the signal processing device according to the third embodiment. The portions identical to those in FIGS. 1 and 6 are denoted with the same reference numerals, and the description of those portions is omitted.

The timing-signal generator circuit 925 shown in FIG. 9 includes a PLL circuit 925a, gate generator circuits 925b and 925g, and divider/phase adjuster circuits 925c to 925f and 925h to 925j. The PLL circuit 925a multiplies a frequency of a clock signal output from the SSCG circuit 27. The gate generator circuit 925b generates an SH signal. The divider/phase adjuster circuit 925c generates clocks $\phi$1 and $\phi$2. The divider/phase adjuster circuit 925d generates a clock RS. The divider/phase adjuster circuit 925e generates a clock CP. The divider/phase adjuster circuit 925f generates a clock $\phi$2L. The gate generator circuit 925g generates a signal for driving each of the clamp circuits 18a and 18b. The divider/phase adjuster circuit 925h generates a clock SPL. The divider/phase adjuster circuit 925i generates a clock for driving each of the ADC circuits 22a and 22b. The divider/phase adjuster circuit 925j generates a clock for driving the MPX circuit 23.

The ASIC 50 includes both the DLL circuit 31 and the DLL circuit 41, so that it is possible to realize the effects in the first and second embodiments simultaneously.

Figure 10:
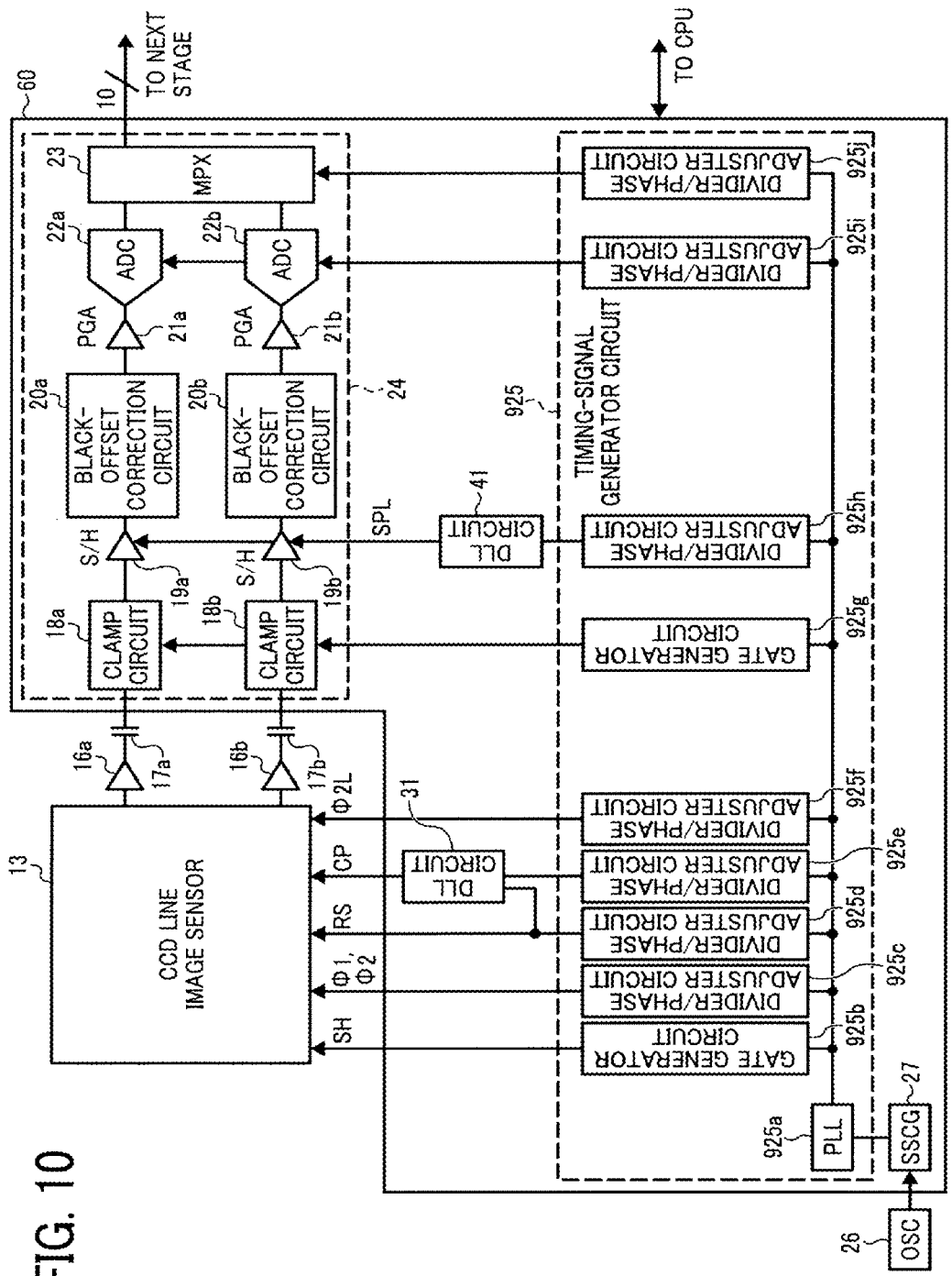
FIG. 10 is a block diagram of a modified example of the signal processing device shown in FIG. 9.
Figure 13:
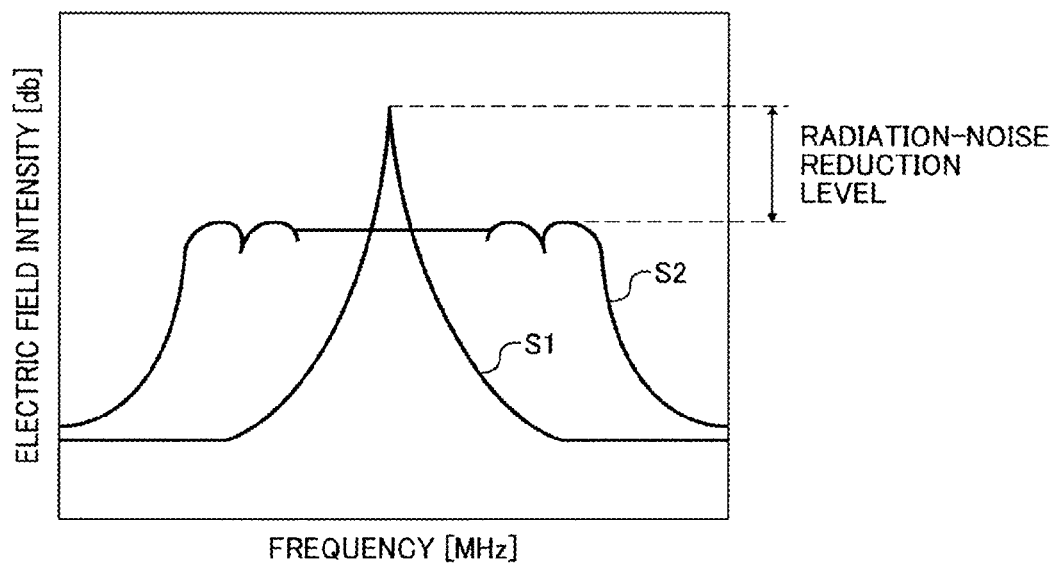
FIG. 13 is a waveform diagram for explaining an effect of a spread-spectrum modulation.
Figure 14:
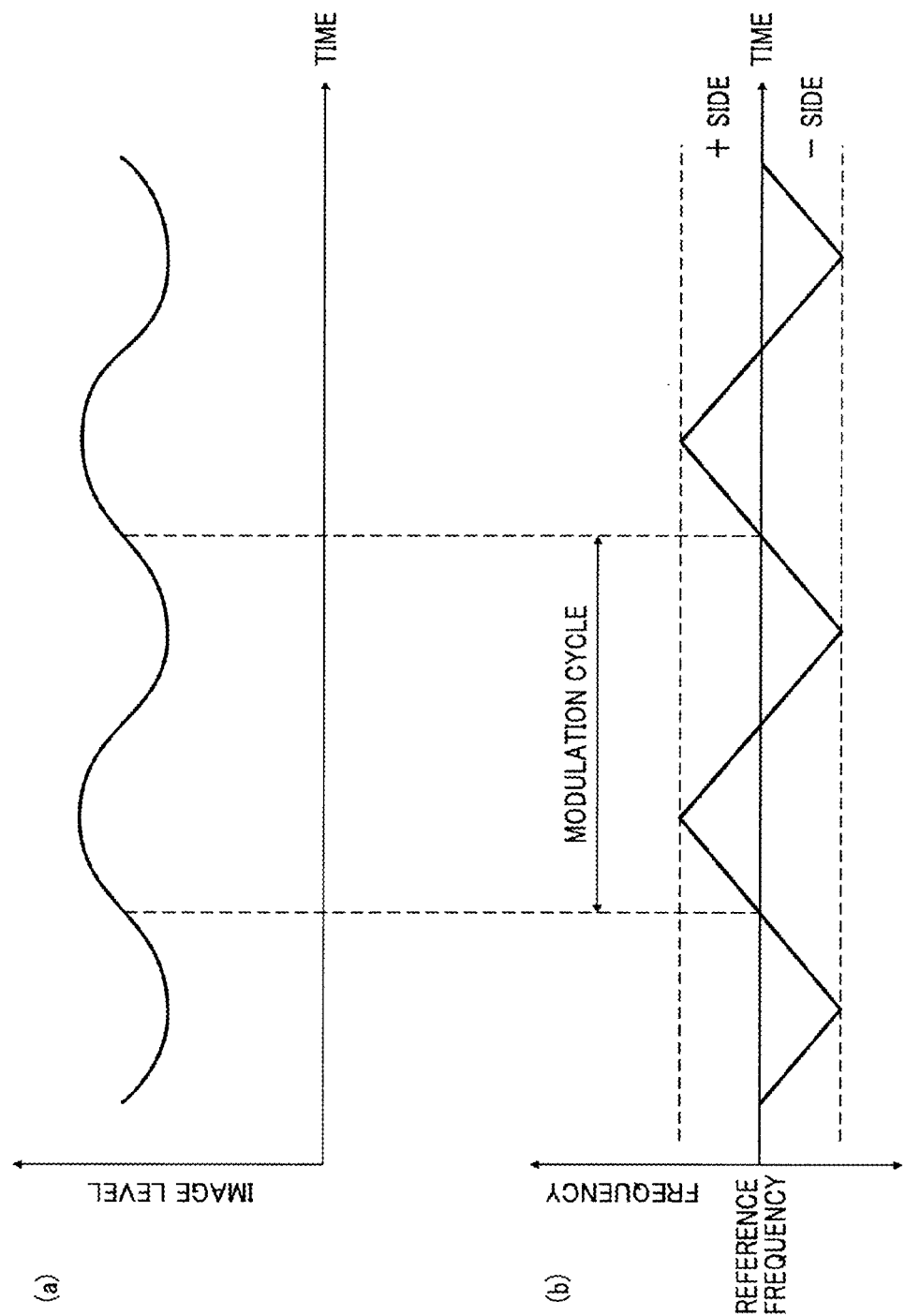
FIG. 14 is a waveform diagram for explaining a problem caused when a frequency spectrum of a clock is spread to cope with an intensity of unwanted radiation.
Figure 15:
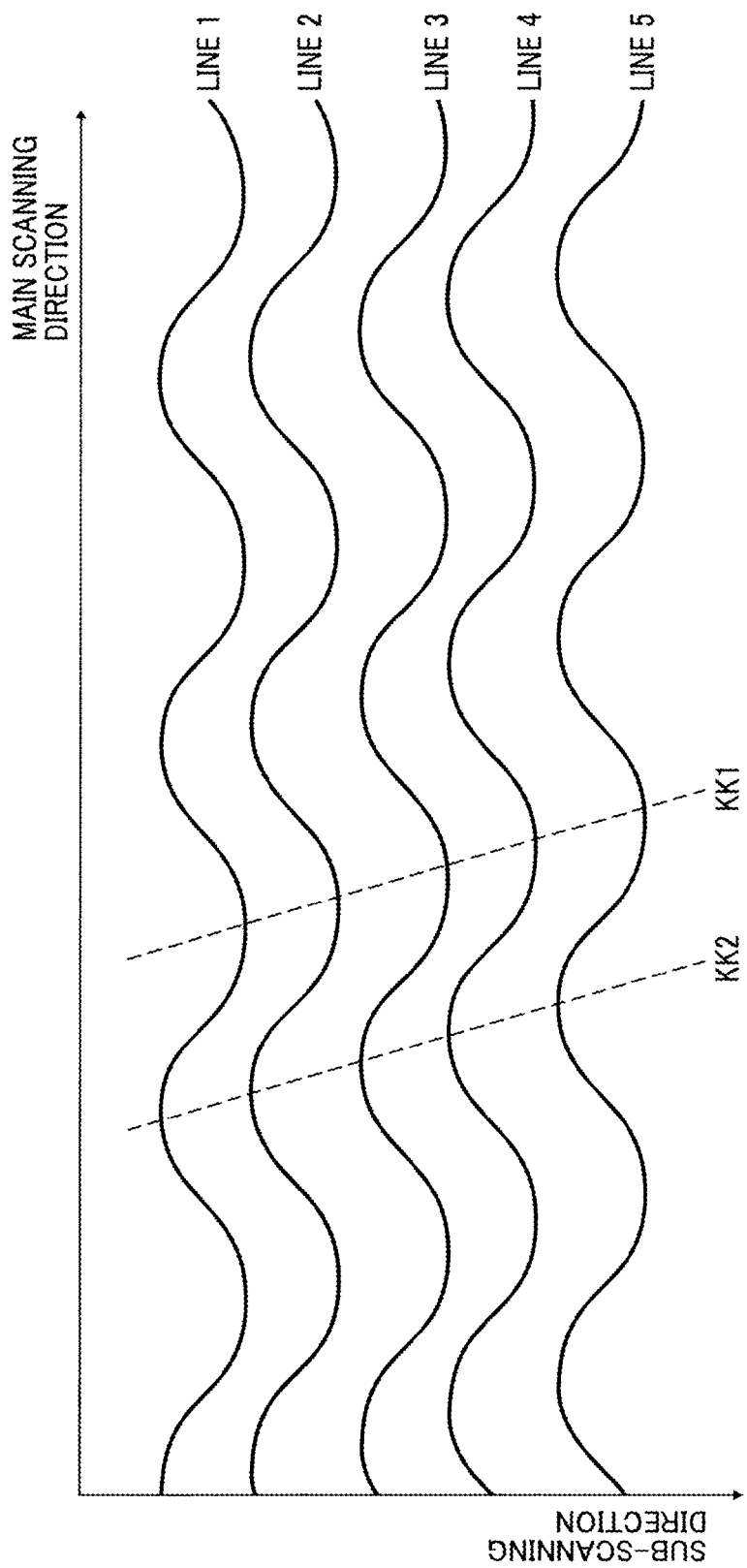
FIG. 15 is a schematic diagram for explaining the problem caused when the frequency spectrum of the clock is spread to cope with the intensity of unwanted radiation.
Figure 16:
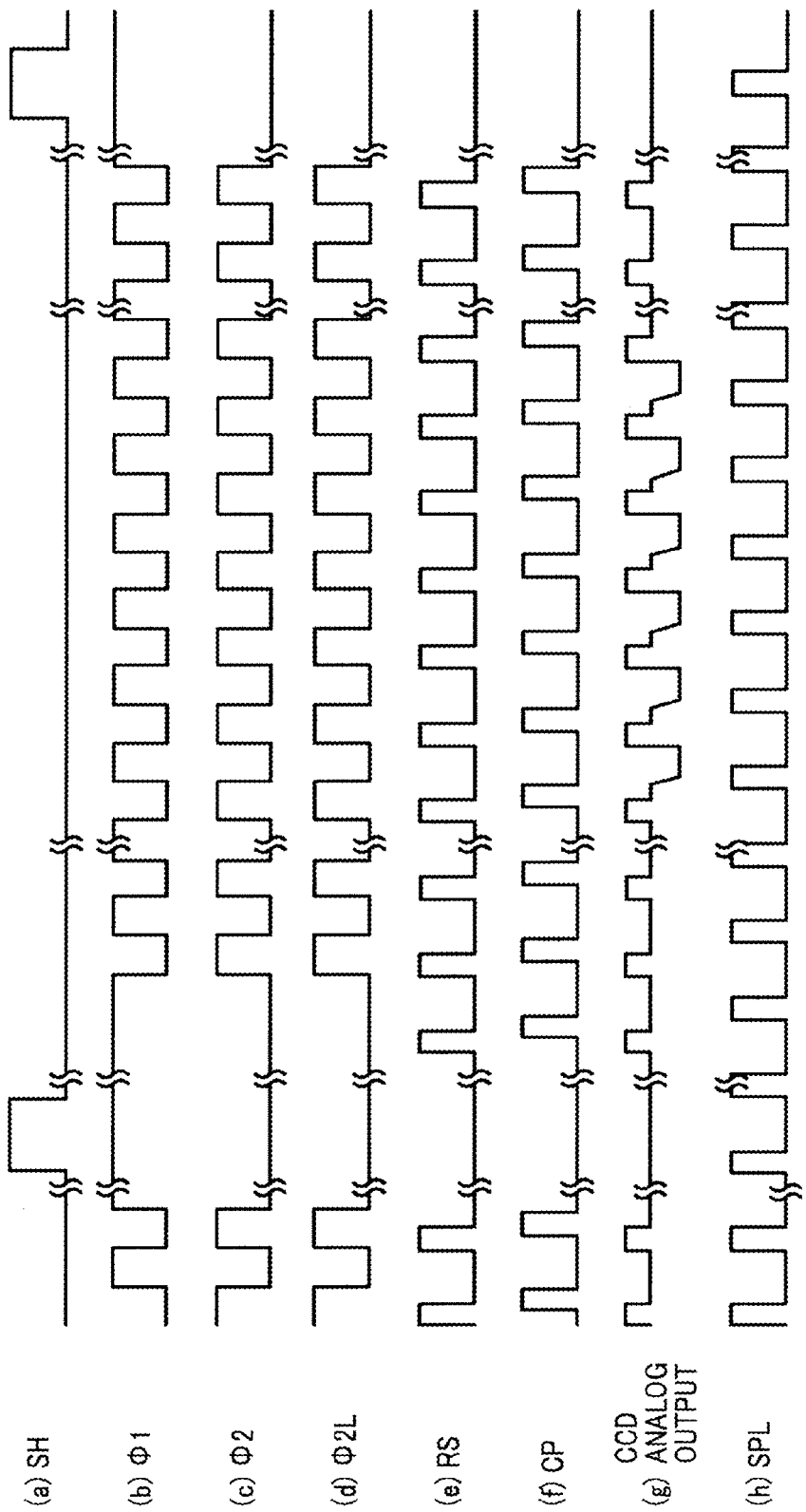
FIG. 16 is a timing chart for explaining an example of a timing for driving a CCD line image sensor.
Figure 17:
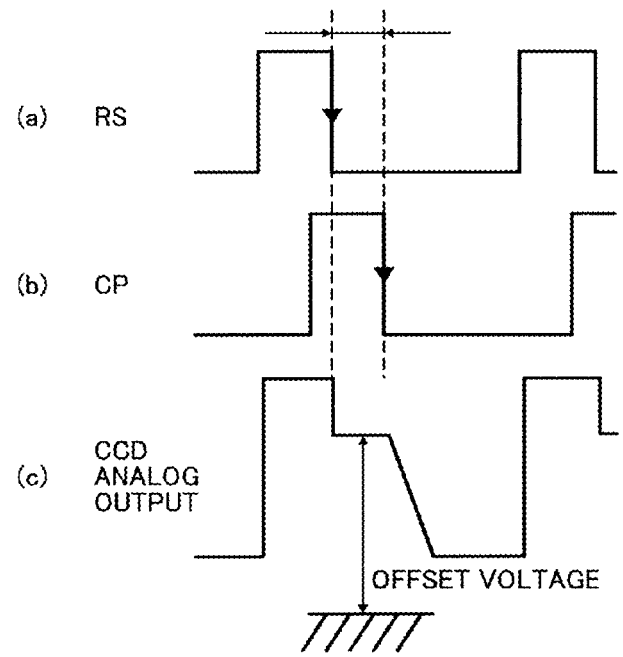
FIG. 17 is a waveform diagram for explaining a fluctuation in an offset level of a CCD output.
Figure 18:
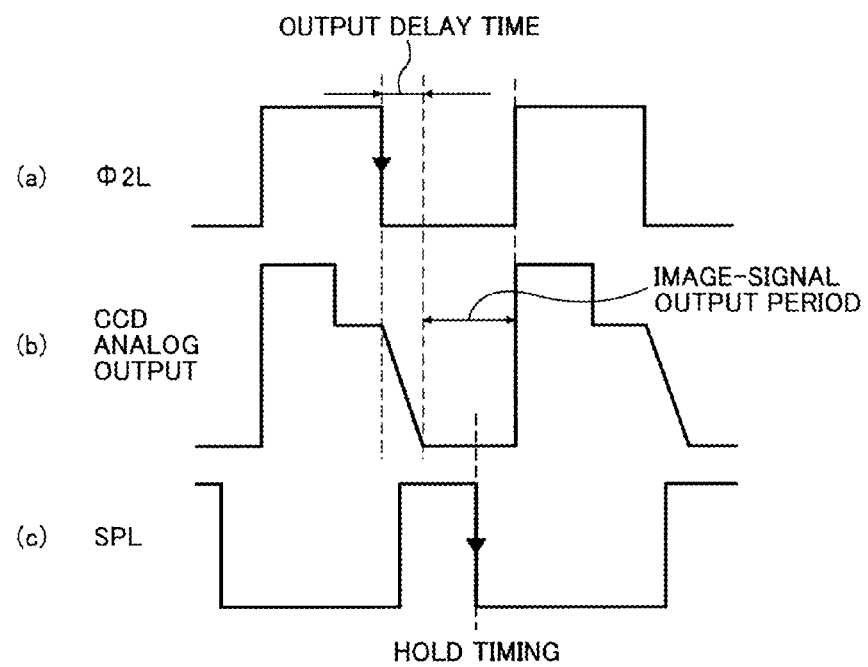
FIG. 18 is a waveform diagram for explaining a shift of a sampling point.

FIG. 10 shows a modified example of the signal processing device according to the third embodiment shown in FIG. 9. In this modified example, the AFE device 24, the SSCG circuit 27, the timing-signal generator circuit 925, the DLL circuit 31, and the DLL circuit 41 compose an ASIC 60 as the signal processing device.

In the embodiments described above, with respect to portions of two clocks where characteristics are changed with a change in a period between edges of the two clocks due to a spread-spectrum modulation, a fixed delay is generated at an edge of one of the two clocks, and an edge of the other clock is generated based on an amount of the fixed delay. Therefore, it is possible to keep the period between the edges of the two clocks constant even when a frequency spectrum of each of the clocks is spread.

Furthermore, when a period between one of edges (i.e., any of a rising edge and a falling edge) of the RS clock and one of edges (i.e., any of a rising edge and a falling edge) of the CP clock is changed due to the spread-spectrum modulation, an offset voltage of the CCD output changes in synchronization with a modulation cycle, and thereby causing stripes on a read image. However, a fixed delay is generated at the one of the edges of the RS clock by the DLL circuit, and a timing of the one of edges of the CP clock is determined based on an amount of the delay. Incidentally, when an amount of the delay is zero, the one of the edges of the CP clock and the one of the edges of the RS clock are controlled to be in the same phase, so that the period between the one of the edges of the RS clock and the one of the edges of the CP clock can be fixed. Thus, it is possible to prevent an occurrence of stripes on a read image.

Likewise, when a period between one of edges (i.e., any of a rising edge and a falling edge) of the $\phi$2L clock and one of edges (i.e., any of a rising edge and a falling edge) of the SPL clock is changed due to the spread-spectrum modulation, a hold point while a CCD analog image signal is output and a sampling level change in synchronization with the modulation cycle, and thereby causing stripes on the read image. However, a fixed delay is generated at the one of the edges of the $\phi$2L clock by the DLL circuit, and a timing of the one of the edges of the SPL clock is determined based on an amount of the delay. Incidentally, when an amount of the delay is zero, the one of the edges of the $\phi$2L clock and the one of the edges of the SPL clock are controlled to be in the same phase, so that the period between the one of the edges of the $\phi$2L clock and the one of the edges of the SPL clock can be fixed. Thus, it is possible to prevent an occurrence of stripes on the read image.

Even when a frequency spectrum of each of the clocks is spread, the period between the edges of the two clocks can be fixed. Therefore, in a case where a fixed delay is generated at an edge of a reference clock by the DLL circuit, when a phase difference between the two clocks is reflected in an amount of delay, constants of the loop filter are set not to respond to a modulation frequency in the spread-spectrum modulation. Therefore, even when the spread-spectrum clock is used as the reference clock, it is possible to generate a fixed delay capable of being unaffected by the spread-spectrum modulation. Consequently, it is possible to prevent an occurrence of stripes on the read image.

Further more, an amount of delay of any one of the two clocks to be delayed can be arbitrarily adjusted by being controlled from outside the signal generator via the CPU. Therefore, it is possible to determine an edge timing of the clock depending on a specification of the in-use device (i.e., the CCD line image sensor).

Moreover, when a fixed delay is generated based on one of edges (i.e., any of a rising edge and a falling edge) of the reference clock, it is possible to select either the rising edge or the falling edge. Therefore, it is possible to determine an edge timing of the clock depending on the specification of the in-use device (i.e., the CCD line image sensor).

Furthermore, a modulation frequency (a modulation cycle) of an SSCG element, which applies the spread-spectrum modulation to the clock, changes depending on a spreading width and a frequency spectrum of the input clock. Therefore, constants of the loop filter included in the DLL circuit are changed to those capable of cutting the modulation frequency. Thus, any kinds of SSCG elements are applicable.

Moreover, a clock generating unit, a spread-spectrum-clock generating unit (the SSCG circuit), and a fixed-delay generating unit (the DLL circuit) are integrated in the same package. Therefore, it is possible to provide a small-footprint image reading device at low cost.

Furthermore, the clock generating unit, the spread-spectrum-clock generating unit (the SSCG circuit), the fixed-delay generating unit (the DLL circuit), and an AFE unit that performs analog signal processing are integrated in the same package. Therefore, it is possible to provide a small-footprint image reading device at low cost.

Incidentally, the present invention is applied to a single scanner in the above embodiments. Alternatively, the present invention can be applied to an image forming apparatus including a scanner function, such as a copier, a facsimile machine, and an MFP.

According to an aspect of the present invention, for example, with respect to portions of two clocks where characteristics are changed with a change in a period between edges of the two clocks due to a spread-spectrum modulation, a fixed delay is generated at an edge of one of the two clocks, and an edge of the other clock is generated based on an amount of the fixed delay. Therefore, it is possible to keep the period between the edges of the two clocks constant even when a frequency spectrum of each of the clocks is spread.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An image reading device comprising:
    an optical-to-electrical conversion element that receives an optical signal of an optical image, and outputs an electrical signal of an analog image signal corresponding to the optical image;
    an analog processing circuit that samples the analog image signal output from the optical-to-electrical conversion element to obtain continuous analog image signals, and amplifies a voltage of the analog image signals to a predetermined voltage;
    an analog-to-digital conversion circuit that quantizes an output from the analog processing circuit to generate a digital image signal;
    a clock generating unit that generates temporally-continuous clock signals;
    a spread-spectrum clock-signal generating unit that generates a spread-spectrum clock signal by modulating a frequency spectrum of a clock signal generated by the clock-signal generating unit;
    a clock-signal generating unit that generates a plurality of drive clock signals for driving the optical-to-electrical conversion element and the analog processing circuit from the spread-spectrum clock signal generated by the spread-spectrum clock-signal generating unit; and
    a signal delaying unit that generates, with respect to at least a first drive clock signal from among the drive clock signals, a fixed delay unaffected by a spread spectrum based on an edge timing of a second drive clock signal other than the first drive clock signal, and obtains a desired timing by applying the fixed delay to the first drive clock signal,
    wherein the signal delaying unit generates a first edge of a clamp signal supplied to the optical-to-electrical conversion element from among the drive clock signals at a same timing as a first edge of a reset signal supplied to the optical-to-electrical conversion element, generates the fixed delay based on a timing of the first edge of the reset signal, and forms a desired clamp signal timing by applying the fixed delay to the clamp signal.

2. The image reading device according to claim 1, wherein the signal delaying unit includes a filter circuit that filters out a noise from the spread-spectrum clock signal, and updates the amount of the fixed delay based on an output signal from the filter circuit.

3. The image reading device according to claim 2, wherein the filter circuit cuts off a modulation frequency of the spread-spectrum clock-signal generating unit.

4. An image reading device comprising:
    an optical-to-electrical conversion element that receives an optical signal of an optical image, and outputs an electrical signal of an analog image signal corresponding to the optical image;
    an analog processing circuit that samples the analog image signal output from the optical-to-electrical conversion element to obtain continuous analog image signals, and amplifies a voltage of the analog image signals to a predetermined voltage;
    an analog-to-digital conversion circuit that quantizes an output from the analog processing circuit to generate a digital image signal;
    a clock generating unit that generates temporally-continuous clock signals;
    a spread-spectrum clock-signal generating unit that generates a spread-spectrum clock signal by modulating a frequency spectrum of a clock signal generated by the clock-signal generating unit;
    a clock-signal generating unit that generates a plurality of drive clock signals for driving the optical-to-electrical conversion element and the analog processing circuit from the spread-spectrum clock signal generated by the spread-spectrum clock-signal generating unit; and
    a signal delaying unit that generates, with respect to at least a first drive clock signal from among the drive clock signals, a fixed delay unaffected by a spread spectrum based on an edge timing of a second drive clock signal other than the first drive clock signal, and obtains a desired timing by applying the fixed delay to the first drive clock signal,
    wherein the signal delaying unit generates a first edge of a sampling clock signal supplied to the analog processing circuit at a same timing as a first edge of a last-stage shift pulse signal supplied to the analog processing circuit, generates the fixed delay based on a timing of the first edge of the last-stage shift pulse signal, and forms a desired sampling clock signal timing by applying the fixed delay to the sampling clock signal.

5. The image reading device according to claim 4, wherein the signal delaying unit includes a filter circuit that filters out a noise from the spread-spectrum clock signal, and updates the amount of the fixed delay based on an output signal from the filter circuit.

6. The image reading device according to claim 5, wherein the filter circuit cuts off a modulation frequency of the spread-spectrum clock-signal generating unit.

* * * * *